(12) United States Patent
Zhang

(10) Patent No.: US 9,349,984 B2
(45) Date of Patent: May 24, 2016

(54) ENCAPSULATION STRUCTURE AND ENCAPSULATING METHOD OF OLED DEVICE

(71) Applicant: BOE TECHNOLOGY GROUP CO., LTD., Beijing (CN)

(72) Inventor: Yuxin Zhang, Beijing (CN)

(73) Assignee: BOE TECHNOLOGY GROUP CO., LTD, Beijing (CN)

(*) Notice: Subject to any disclaimer, the term of this patent is extended or adjusted under 35 U.S.C. 154(b) by 13 days.

(21) Appl. No.: 14/360,172

(22) PCT Filed: Nov. 30, 2013

(86) PCT No.: PCT/CN2013/088246
§ 371 (c)(1),
(2) Date: May 22, 2014

(87) PCT Pub. No.: WO2015/043053
PCT Pub. Date: Apr. 2, 2015

(65) Prior Publication Data
US 2015/0179970 A1    Jun. 25, 2015

(30) Foreign Application Priority Data

Sep. 24, 2013   (CN) .......................... 2013 1 0439879

(51) Int. Cl.
*H01L 21/00*  (2006.01)
*H01L 51/52*  (2006.01)
*H01L 51/56*  (2006.01)

(52) U.S. Cl.
CPC ............. *H01L 51/524* (2013.01); *H01L 51/56* (2013.01)

(58) Field of Classification Search
CPC ..................... H01L 51/5293; H01L 51/524
USPC ............................. 438/116; 257/434
See application file for complete search history.

(56) References Cited

U.S. PATENT DOCUMENTS 7,268,489 B2    9/2007  Kim et al.
2007/0120157 A1*  5/2007  Kim .............................. 257/291
(Continued)

FOREIGN PATENT DOCUMENTS

CN       2001-319775 A    11/2001
CN         1638582 A      7/2005
(Continued)

OTHER PUBLICATIONS

Translation of JP2011-165497 A, Miyagawa et al. (Panasonic Electric) (Aug. 25, 2011), 29 pages.*
(Continued)

*Primary Examiner* — Caridad Everhart
(74) *Attorney, Agent, or Firm* — Collard & Roe, P.C.

(57) ABSTRACT

An encapsulation structure for OLED device comprises a glass substrate, a glass cover plate, an OLED device and a sealing layer. The glass substrate has a recessed portion, the glass cover plate is located at an opening of the recessed portion, and a periphery of the glass cover plate and the glass substrate are bonded through a frit barricade formed by melted glass powders, so that the glass cover plate and the glass substrate have an integral structure, a closed cavity is formed by the glass cover plate and the recessed portion, and both the OLED device and the sealing layer are located within the closed cavity. With the above encapsulation structure, water vapor and oxygen gas can be prevented from entering the OLED device, and service life of the OLED device is prolonged. There is further disclosed an encapsulating method.

12 Claims, 2 Drawing Sheets

(56) References Cited

U.S. PATENT DOCUMENTS

| | | | |
|---|---|---|---|
| 2009/0101897 A1* | 4/2009 | Murphy et al. | 257/48 |
| 2012/0205676 A1* | 8/2012 | Seo et al. | 257/88 |
| 2013/0213852 A1* | 8/2013 | Yamazaki et al. | 206/701 |

FOREIGN PATENT DOCUMENTS

| | | |
|---|---|---|
| CN | 102255056 A | 11/2011 |
| CN | 2023481281 U | 3/2014 |
| JP | 2011-165497 A | 8/2011 |

OTHER PUBLICATIONS

English Translation of the International Search Report of PCT/CN2013/088246 published in English on Apr. 2, 2015.

International Search Report, International Preliminary Report on Patentability and Written Opinion of the International Searching Authority of PCT/CN2013/088246 in Chinese, mailed Jul. 9, 2014.

English translation of the International Preliminary Report on Patentability and Written Opinion of the International Searching Authority of PCT/CN2013/088246, issued Mar. 29, 2016.

* cited by examiner

ENCAPSULATION STRUCTURE AND ENCAPSULATING METHOD OF OLED DEVICE

CROSS REFERENCE TO RELATED APPLICATIONS

This application is the National Stage of PCT/CN2013/088246 filed on Nov. 30, 2013, which claims priority under 35 U.S.C. §119 of Chinese Application No. 201310439879.5 filed on Sep. 24, 2013, the disclosure of which is incorporated by reference.

TECHNICAL FIELD

Embodiments of the present invention relate to an encapsulation structure and encapsulating method of an OLED device.

BACKGROUND

An OLED device refers to such an electroluminescent device that is formed of an organic semiconductor material and a luminous material and is caused to emit light through injection and recombination of carriers upon it being driven by an electric field. OLED devices have many advantages and possess bright prospects in the field of display. OLED devices are very sensitive to water vapor and oxygen gas, and water vapor and oxygen gas that permeate into OLED devices are main factors that affect lifetime of the OLED devices. Water vapor and oxygen gas incur chemical reactions with the organic materials, leading to malfunction of the OLED device. For example, OLED devices belong to devices of a direct current (DC) driven type, and when an OLED device is in an operating state, a miniature electrolytic cell is produced inside the device if water vapor exists in the device, resulting in an electrochemical reaction. The produced reaction gas may separate a metal cathode from an organic function layer, leading to malfunction of the device.

Therefore, how to provide an encapsulation structure capable of preventing water vapor and oxygen gas from permeating into the OLED device is one of urgent technical problems to be solved.

SUMMARY

According to embodiments of the present invention, there are provided an encapsulation structure and encapsulating method of an OLED device. With the encapsulation structure of the OLED device, water vapor and oxygen gas can be prevented from entering the OLED device, and then, service life of the OLED device is prolonged.

In an aspect of the invention, there is provided an encapsulation structure for OLED device, comprising a glass substrate, a glass cover plate, an OLED device and a sealing layer. The glass substrate has a recessed portion, the glass cover plate is located at an opening of the recessed portion, and a periphery of the glass cover plate and the glass substrate are bonded through a frit barricade formed by melted glass powders, so that the glass cover plate and the glass substrate have an integral structure, a closed cavity is formed by the glass cover plate and the recessed portion, and both the OLED device and the sealing layer are located within the closed cavity.

For example, the OLED device is disposed on a bottom surface of the recessed portion, and the sealing layer fills up remaining space within the closed cavity. For example, in a direction from the bottom surface of the recessed portion toward the glass cover plate, a distance between two opposite side walls of the closed cavity becomes larger gradually.

For example, the OLED device is disposed on a face of the glass cover plate facing a bottom surface of the recessed portion, and the sealing layer fills up remaining space within the closed cavity. For example, in a direction from the bottom surface of the recessed portion toward the glass cover plate, a distance between two opposite side walls of the closed cavity becomes larger gradually.

For example, the sealing layer is a transparent sealing layer formed of silicone oil, a resin or liquid crystals.

For example, one face of the glass cover plate facing way from a bottom surface of the recessed portion is flush with an upper edge of the recessed portion of the glass substrate.

In another aspect of the invention, there is further provided an encapsulating method for the encapsulation structure of the OLED device as stated above, comprising: forming a recessed portion on a glass substrate, and producing an OLED device, filling a sealing layer in the recessed portion to form a sealing layer, placing a glass cover plate over an opening of the recessed portion, so that the OLED device and the sealing layer are enclosed within the recessed portion; filling glass powders in a gap between the periphery of the glass cover plate and the side wall of the recessed portion; bonding the glass substrate and the glass cover plate into an integral structure by using a laser packaging method in which a laser head is controlled to scan along glass powder to let the glass powder melt, so that a closed cavity is formed by the glass cover plate and the recessed portion.

For example, a recessed portion having a stepwise configuration is formed on the glass substrate, and a width along a bottom surface of the recessed portion is smaller than a width of an opening of the recessed portion; an OLED device is produced on a bottom surface of the recessed portion; a sealing material is filled in the recessed portion to form a sealing layer; the glass cover plate is placed over a step face possessed by a side wall of the recessed portion, so as to enclose the OLED device and the sealing layer within the recessed portion.

Preferably, a recessed portion having a stepwise configuration is produced on the glass substrate, and a width along a bottom surface of the recessed portion is smaller than a width of an opening of the recessed portion, a sealing material is filled in the recessed portion, and an OLED device is produced on a face of the glass cover plate, the glass cover plate is placed over a step face possessed by a side wall of the recessed portion in a state where a face of the glass cover plate on which the OLED device is disposed faces a bottom surface of the recessed portion, and the sealing material is formed into a sealing layer, so as to enclose the OLED device and the sealing layer within the recessed portion.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

FIG. 2b is a structurally schematic view when an OLED device is provided on the bottom surface of the recessed portion of the glass substrate structured as illustrated in FIG. 2a;

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Figure 1:
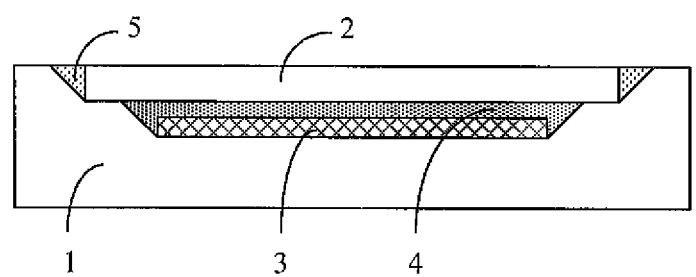
FIG. 1 is a structurally schematic view when an OLED device in an encapsulation structure of the OLED device provided by an embodiment of the invention is disposed on a bottom surface of a recessed portion of a glass substrate.
Figure 2A:
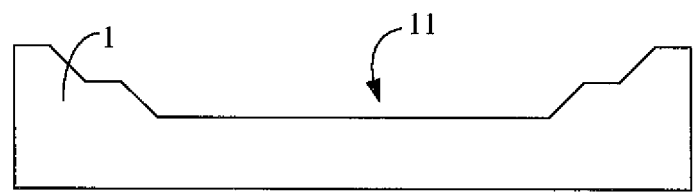
FIG. 2a is a structurally schematic view illustrating a glass substrate in an encapsulation structure for OLED device provided by an embodiment of the invention.
Figure 3:
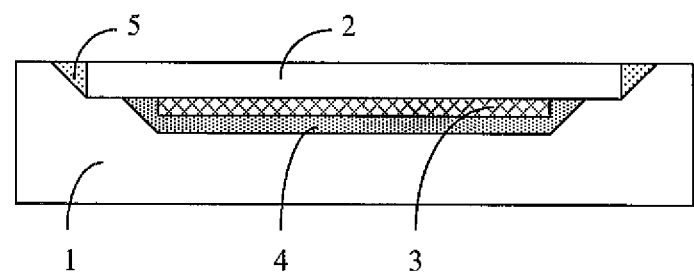
FIG. 3 is a structurally schematic view when an OLED device in an encapsulation structure for OLED device provided by an embodiment of the invention is disposed on a face of a glass cover plate facing a bottom surface of a recessed portion of a glass substrate.

FIG. 1 is a structurally schematic view when an OLED device in an encapsulation structure of the OLED device provided by an embodiment of the invention is disposed on a bottom surface of a recessed portion of a glass substrate; FIG. 2a is a structurally schematic view illustrating a glass substrate in an encapsulation structure for OLED device provided by an embodiment of the invention; FIG. 3 is a structurally schematic view when an OLED device in an encapsulation structure for OLED device provided by an embodiment of the invention is disposed on a face of a glass cover plate facing a bottom surface of a recessed portion of a glass substrate.

As illustrated in FIG. 1 and FIG. 3, an encapsulation structure for OLED device provided by the embodiment includes a glass substrate 1, a glass cover plate 2, an OLED device 3 and a sealing layer 4.

As illustrated in FIG. 2a, the glass substrate 1 has a recessed portion 11, and the glass cover plate 2 is located at an opening of the recessed portion 11. The periphery of the glass cover plate 2 and the glass substrate 1 are bonded together through a frit barricade 5 formed by melted glass powders, so that the glass cover plate 2 and the glass substrate 1 have an integral structure. A closed cavity is formed by the glass cover plate 2 and the recessed portion 11 of the glass substrate 1, and both the OLED device 3 and the sealing layer 4 are located within the closed cavity.

In the above encapsulation structure of the OLED device, the periphery of the glass cover plate 2 and the glass substrate 1 are bonded together through the frit barricade 5 formed by melted glass powders, so that the glass cover plate 2 and the glass cover plate 1 form an integral structure, and the glass cover plate 2 functions in cooperation with the recessed portion 11 of the glass substrate 1 to form a closed cavity, within which the produced OLED device 3 and sealing layer 4 are located.

An all-glass encapsulation is implemented with the glass substrate 1, the glass cover plate 2 and the frit barricade 5. The glass material has a good obstruction property with respect to water vapor and oxygen gas, and then can prevent water vapor and oxygen gas outside the encapsulation structure from entering the closed cavity. In turn, this prevents water vapor and oxygen gas from entering the OLED device 3, and prolongs the service life of the OLED device 3.

Thus, the encapsulation structure of the OLED device provided by embodiments of the invention can prevent water vapor and oxygen gas from entering the OLED device, thereby prolong the service life of the OLED device.

In the encapsulation structure of the OLED device provided by embodiments of the invention, the OLED device 3 may have a variety of setting configurations.

Configuration 1

Please continue to refer to FIG. 1. The OLED device 3 may be arranged on a bottom surface of the recessed portion 11 of the glass substrate 1, while the sealing layer 4 fills the remaining space within the closed cavity. As such, sides of the OLED device 3 and a face of the OLED device 3 facing away from the bottom surface of the recessed portion 11 can be better sealed by the sealing layer 4.

On the basis of configuration 1, in order to facilitate the preparation of the sealing layer 4 so that the periphery of the OLED device 3 can be better sealed by the sealing layer 4, in the direction from the bottom surface of the recessed portion 11 toward the glass cover plate 2, the distance between two opposite side walls of the closed cavity may become larger gradually.

Configuration 2

Please continue to refer to FIG. 3. The OLED device 3 may also be arranged on a face of the glass cover plate 2 facing a bottom surface of the recessed portion 11, and the sealing layer 4 fills up the remaining space in the closed cavity.

The sealing layer 4 fills up the remaining space in the closed cavity formed by the assembly of the glass cover plate 2 and the recessed portion 11, so that sides of the OLED device 3 and a face of the OLED device 3 facing away from the glass cover plate 2 can be better sealed by the sealing layer 4.

On the basis of configuration 2, in order to facilitate the preparation of the sealing layer 4, in the direction from the bottom surface of the recessed portion toward the glass cover plate, the distance between two opposite side walls of the closed cavity may become large gradually.

For example, in an OLED-device encapsulation structure provided by each embodiment as stated above, the sealing layer 4 is a transparent sealing layer formed of silicon oil, a resin or liquid crystals. The transparent sealing layer does not bring an effect on light exiting efficiency of the OLED device as it emits light, and display quality of the OLED device can be improved. The used amount of silicon oil, the resin or liquid crystals can be obtained from calculation.

In order to improve the appearance of the encapsulation structure of the OLED device, a face of the glass cover plate 2 facing away from the bottom surface of the recessed portion 11 is flush with an upper edge of the recessed portion 11 of the glass substrate 1.

According to an embodiment of the invention, there is further provided an encapsulating method for the encapsulation structure of the OLED device as stated above. The method can be performed as follows.

Step S601, a recessed portion is formed on a glass substrate, and an OLED device is produced, a sealing material is filled in the recessed portion to form a sealing layer, a glass cover plate is placed over an opening of the recessed portion to cover the opening, so that the OLED device and the sealing layer are enclosed within the recessed portion by the cover.

Step S602, a gap between the periphery of the glass cover plate and the side wall of the recessed portion is filled with glass powders.

Step S603, the glass substrate and the glass cover plate are bonded into an integral structure by using a laser packaging method, for example, a laser head is made to scan the glass powder under the control of a personal computer (PC) so that the glass powders melt, and then a closed cavity is formed by the glass cover plate and the recessed portion.

In the encapsulating method for the encapsulation structure of the OLED device as stated above, the laser packaging method in step S603 is used to melt the glass powder that exists at a gap between the periphery of the glass cover plate and the side wall of the recessed portion by filling in step S602, thereby realizing a bond between the periphery of the glass cover plate and the glass substrate. Eventually, the glass substrate and the glass cover plate are bonded into an integral structure, so that a closed cavity is formed by coordination of the glass cover plate and the recessed portion of the glass substrate. The assembly position in step S601 positions the OLED device and the sealing layer in the closed cavity, and then, an all-glass encapsulation of the OLED device is achieved.

A specific example of step S601 may be carried out as follows.

Figure 2B:
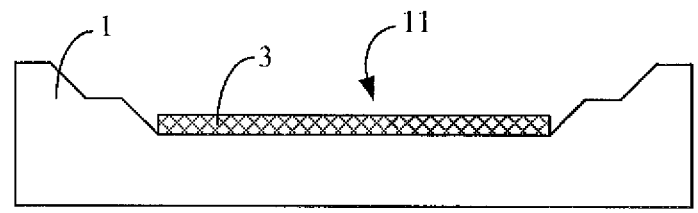
Figure 2C:
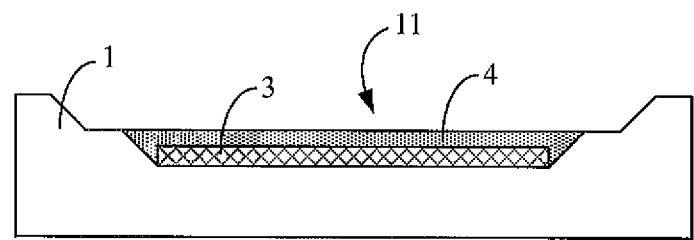
FIG. 2c is a structurally schematic view when a sealing layer is formed on the glass substrate and the OLED device structured as illustrated in FIG. 2b.

As illustrated in FIG. 2a, a recessed portion 11 having a stepwise configuration is formed on a glass, substrate 1, and the width along a bottom surface of the recessed portion 11 is smaller than the width of an opening of the recessed portion; as illustrated in FIG. 2b, an OLED device 3 is produced on the bottom surface of the recessed portion 11; as illustrated in FIG. 2c, a sealing material is filled in the recessed portion 11 to form a sealing layer 4; and next, a glass cover plate 2 is placed over a step face possessed by a side wall of the recessed portion 11.

Then, the encapsulation structure of the OLED device illustrated in FIG. 1 is eventually obtained through step S602 and step S603, realizing an all-glass encapsulation of the OLED device 3.

Another specific example of the step S601 may be carried out as follows.

A recessed portion having a stepwise configuration is produced on a glass substrate, and the width along a bottom surface of the recessed portion is smaller than the width of an opening of the recessed portion. A sealing material is filled in the recessed portion, and an OLED device is produced on a face of the glass cover plate. The glass cover plate is placed over a step face possessed by a side wall of the recessed portion in the case where its face on which the OLED device is disposed faces a bottom surface of the recessed portion, and the sealing material is formed into a sealing layer.

Then, the encapsulation structure of the OLED device illustrated in FIG. 3 is obtained through step S602 and step S603, so that an all-glass encapsulation of the OLED device 3 can also be achieved.

Figure 4:
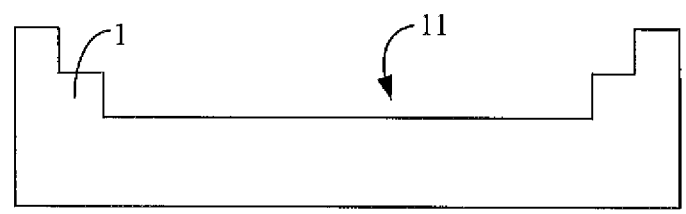
FIG. 4 is a schematic view illustrating a kind of structure of a recessed portion that is disposed at a glass substrate in an encapsulation structure for OLED device provided by an embodiment of the invention.
Figure 5:
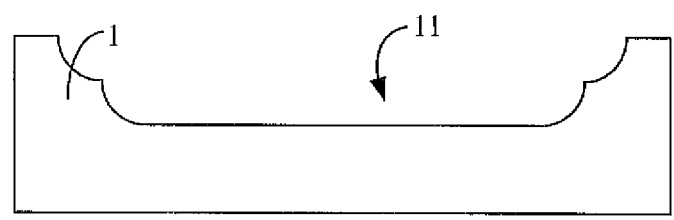
FIG. 5 is a schematic view illustrating another kind of structure of a recessed portion that is disposed at a glass substrate in an encapsulation structure for OLED device provided by an embodiment of the invention.

Further, in the above two specific examples of step S601, the shape of the recessed portion formed on the glass substrate is not limited to the shape illustrated in FIG. 2a, and it may also be the configurations illustrated in FIG. 4 and FIG. 5.

Descriptions made above are merely exemplary embodiments of the invention, but are not used to limit the protection scope of the invention. The protection scope of the invention is determined by attached claims.

The invention claimed is:

1. An encapsulation structure for OLED device, comprising a glass substrate, a glass cover plate, an OLED device and a sealing layer,
    wherein the glass substrate has a recessed portion, the glass cover plate is located at an opening of the recessed portion, and a periphery of the glass cover plate and the glass substrate are bonded through a frit barricade formed by melted glass powders, so that the glass cover plate and the glass substrate have an integral structure, a closed cavity is formed by the glass cover plate and the recessed portion, and both the OLED device and the sealing layer are located within the closed cavity; and
    wherein in a direction from the bottom surface of the recessed portion toward the glass cover plate, a distance between two opposite side walls of the closed cavity becomes larger gradually.

2. The encapsulation structure claimed as claim 1, wherein the OLED device is disposed at a bottom surface of the recessed portion, and the sealing layer fills up remaining space within the closed cavity.

3. The encapsulation structure claimed as claim 2, wherein the sealing layer is a transparent sealing layer formed of silicone oil, a resin or liquid crystals.

4. The encapsulation structure claimed as claim 3, wherein one face of the glass cover plate facing way from a bottom surface of the recessed portion is flush with an upper edge of the recessed portion of the glass substrate.

5. The encapsulation structure claimed as claim 1, wherein the OLED device is disposed on a face of the glass cover plate facing a bottom surface of the recessed portion, and the sealing layer fills up remaining space within the closed cavity.

6. The encapsulation structure claimed as claim 5, wherein the sealing layer is a transparent sealing layer formed of silicone oil, a resin or liquid crystals.

7. The encapsulation structure claimed as claim 6, wherein one face of the glass cover plate facing way from a bottom surface of the recessed portion is flush with an upper edge of the recessed portion of the glass substrate.

8. The encapsulation structure claimed as claim 1, wherein the sealing layer is a transparent sealing layer formed of silicone oil, a resin or liquid crystals.

9. The encapsulation structure claimed as claim 8, wherein one face of the glass cover plate facing way from a bottom surface of the recessed portion is flush with an upper edge of the recessed portion of the glass substrate.

10. An encapsulating method for the encapsulation structure for OLED device, comprising:
    forming a recessed portion on a glass substrate, and producing an OLED device, filling a sealing layer in the recessed portion to form a sealing layer, placing a glass cover plate over an opening of the recessed portion, so that the OLED device and the sealing layer are enclosed within the recessed portion;

filling glass powders in a gap between a periphery of the glass cover plate and a side wall of the recessed portion; and bonding the glass substrate and the glass cover plate into an integral structure by using a laser packaging method in which a laser head is controlled to scan along glass powder to let the glass powder melt, so that a closed cavity is formed by the glass cover plate and the recessed portion; and wherein in a direction from the bottom surface of the recessed portion toward the glass cover plate, a distance between two opposite side walls of the closed cavity becomes larger gradually.

11. The encapsulating method claimed as claim 10, wherein a recessed portion having a stepwise configuration is formed on the glass substrate, and a width along a bottom surface of the recessed portion is smaller than a width of an opening of the recessed portion; an OLED device is produced on a bottom surface of the recessed portion; a sealing material is filled in the recessed portion to form a sealing layer; the glass cover plate is placed over a step face possessed by a side wall of the recessed portion so as to enclose the OLED device and the sealing layer within the recessed portion.

12. The encapsulating method claimed as claim 10, wherein a recessed portion having a stepwise configuration is produced on the glass substrate, and a width along a bottom surface of the recessed portion is smaller than a width of an opening of the recessed portion, a sealing material is filled in the recessed portion, and an OLED device is produced on a face of the glass cover plate, the glass cover plate is placed over a step face possessed by a side wall of the recessed portion in a state where a face of glass cover plate on which the OLED device is disposed faces a bottom surface of the recessed portion, and the sealing material is formed into a sealing layer, so as to enclose the OLED device and the sealing layer within the recessed portion.

* * * * *